United States Patent
Pan et al.

(10) Patent No.: US 12,191,853 B2
(45) Date of Patent: Jan. 7, 2025

(54) CONTROL DEVICE WITH CAPACITIVE-TYPE VISUAL KEY STRUCTURE

(71) Applicant: PRIMAX ELECTRONICS LTD., Taipei (TW)

(72) Inventors: Yung-Tai Pan, Taipei (TW); Jui-Jen Cheng, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 86 days.

(21) Appl. No.: 18/059,999

(22) Filed: Nov. 30, 2022

(65) Prior Publication Data

US 2023/0268922 A1 Aug. 24, 2023

Related U.S. Application Data

(60) Provisional application No. 63/312,925, filed on Feb. 23, 2022.

(51) Int. Cl.
*H03K 17/98* (2006.01)
*G06F 3/02* (2006.01)

(52) U.S. Cl.
CPC ............ *H03K 17/98* (2013.01); *G06F 3/0219* (2013.01); *H03K 2217/9653* (2013.01)

(58) Field of Classification Search
CPC ........ G06F 3/02; G06F 3/0202; G06F 3/0219; H03K 2217/96074; H03K 2217/96076; H03K 2217/965; H03K 2217/9651; H03K 2217/9653; H03K 17/962; H03K 17/9622; H03K 17/975; H03K 17/98
See application file for complete search history.

(56) References Cited

U.S. PATENT DOCUMENTS

| | | | | |
|---|---|---|---|---|
| 9,531,381 | B2* | 12/2016 | Chen | H03K 17/98 |
| 11,126,283 | B2* | 9/2021 | Chen | G06F 3/0416 |
| 11,460,932 | B2* | 10/2022 | Saito | G06F 3/038 |
| 11,984,276 | B2* | 5/2024 | Chen | H01H 13/20 |
| 2013/0168214 | A1* | 7/2013 | Liou | H01H 13/705 |
| | | | | 200/5 A |
| 2023/0063378 | A1* | 3/2023 | Hsiang | G06F 3/147 |

* cited by examiner

*Primary Examiner* — Franklin D Balseca
(74) *Attorney, Agent, or Firm* — WPAT, PC (57) ABSTRACT

A control device with a capacitive-type visual key structure is provided. The control device includes a covering member and a transparent keycap. The covering member includes an accommodation space. The transparent keycap is accommodated within the accommodation space. An elastic element, a first electrode, a key circuit board assembly with a second electrode and a display panel are accommodated within the accommodation space. When the transparent keycap is pressed down, the elastic element is correspondingly moved, and a spatial distance between the first electrode and the second electrode is changed. Consequently, a capacitance change value is formed. According to the capacitance change value, the control device judges whether the transparent keycap is pressed down and triggered.

17 Claims, 8 Drawing Sheets

CONTROL DEVICE WITH CAPACITIVE-TYPE VISUAL KEY STRUCTURE

CROSS-REFERENCE TO RELATED APPLICATION

This application claims priority to U.S. Provisional Patent Application No. U.S. 63/312,925 filed Feb. 23, 2022, the contents of which are incorporated herein by reference.

FIELD OF THE INVENTION

The present invention relates to a control device with a key structure, and more particularly to a control device with a capacitive-type visual key structure.

BACKGROUND OF THE INVENTION

Nowadays, a control device with a visual key structure is introduced into the market. This control device comprise a display panel and light-transmissible key structures. Due to the cooperation of the display panel and the light-transmissible key structures, the user can execute the function of a button shortcut operation (or a macro command operation), or the user can self-define specific operation functions of various keys.

For example, in the field of live streaming applications, the control device with the visual key structure is suitable for cooperating with existing input devices. The visual key has a function of displaying a key function visual information for facilitating the user (e.g., the live streamer) to quickly make associated selection and operation in an intuitive manner. In addition, the control device allows the user to self-define the functions of various keys.

The key function visual information includes a static function visual information or a dynamic function visual information. For example, the static function visual information is a visual information about the specific operating function of any key shown on the display panel. The dynamic function visual information is a visual information that is dynamically shown on one or plural keys.

However, the key structure in cooperation with the display panel still has some drawbacks. For example, the key structure needs to be light-transmissible for allowing the image shown on the underlying display panel to pass through. In accordance with the conventional design, the membrane switch with a hollow portion is used for allowing the image to pass through. Moreover, the bump to be pressed down is installed on an elastic element of the key structure. When the keycap is pressed down by the user, the elastic element is moved downwardly and subjected to elastic deformation. Consequently, the bump is moved downwardly to trigger the underlying membrane switch. When the membrane switch is triggered, the associated circuit is switched from the open state to the closed state, and a pressing signal is generated. According to the pressing signal, it is determined that the key structure is triggered.

In the above conventional method, the key structure is a touch type key structure, and the membrane switch is touched by the bump. The operating scenarios of the visual key structures can be applied to some other touch type key structures.

However, the conventional touch type key structures still have some drawbacks. For example, after the bump is moved downwardly to touch the underlying membrane switch, the results of judging whether the key structure is triggered can be obtained. The results include a first result of confirming that the touch action is completed (i.e., the pressing signal is generated) and a second result of confirming that the touch action is not completed (i.e., the pressing signal is not generated). In other words, there is no intermediate state between the first result and the second result in order to expand the applications.

Furthermore, the travel distance of the touch type key structure is fixed, and the response sensitivity of pressing the touch type key structure is fixed. In other words, the travel distance and the response sensitivity cannot be adjusted by the user.

Therefore, it is important to provide a novel method of triggering the key structure in order to overcome the drawbacks of the conventional technologies.

SUMMARY OF THE INVENTION

The present invention provides a control device with a capacitive-type visual key structure. The capacitive-type visual key structure is triggered in a capacitive touch manner.

In accordance with an aspect of the present invention, a control device with a capacitive-type visual key structure is provided. The control device includes a covering member, a transparent keycap, an elastic element, a first electrode, a key circuit board assembly, a display panel and a main control board. The covering member at least includes an upper cover and a lower cover, which are combined together. The transparent keycap is exposed outside through a first opening of the upper cover. The elastic element is attached on the transparent keycap. The first electrode is installed on one of the elastic element and the transparent keycap. The key circuit board assembly includes a second electrode. The first electrode and the second electrode are aligned with each other and electrically connected with each other. In addition, a capacitive structure is formed by the first electrode and the second electrode collaboratively. When the transparent keycap is pressed down, the elastic element is correspondingly moved, and a spatial distance between the first electrode and the second electrode is changed. Consequently, at least one capacitance change value is formed. The key circuit board assembly generates at least key press information according to the at least one capacitance change value. The display panel is aligned with a first perforation of the key circuit board assembly and the transparent keycap. The main control board is electrically connected with the key circuit board assembly and the display panel. The main control board issues at least one key function visual information to the display panel. The at least one key function visual information is visible through the transparent keycap. The at least key press information is inputted into the main control board. The main control board generates and outputs at least one key function control command according to the at least key press information.

In an embodiment, the covering member further includes an inner cover, and the inner cover is arranged between the upper cover and the lower cover. The inner cover is located beside an inner side of the upper cover. The inner cover includes a second opening corresponding to the first opening of the upper cover. The transparent keycap is penetrated through the second opening of the inner cover and the first opening of the upper cover and exposed outside.

In an embodiment, the elastic element includes a second perforation, and the second perforation is aligned with the transparent keycap that is exposed outside the first opening of the upper cover. The at least one key function visual information shown on the display panel is visible on the transparent keycap through the second perforation of the elastic element.

In an embodiment, the first electrode is distributed on a periphery region of the second perforation of the elastic element.

In an embodiment, the first electrode is distributed and disposed on at least a part of one of a first surface region and a second surface region of the elastic element. The elastic element is arranged between the upper cover and the key circuit board assembly. The first surface region of the elastic element is located beside the upper cover. The second surface region of the elastic element is located beside the key circuit board assembly.

In an embodiment, the key circuit board assembly at least includes a circuit board and a supporting structure. The circuit board includes the first perforation. The circuit board with the first perforation is located beside the second surface region of the elastic element. The key circuit board assembly is located over the display panel.

In an embodiment, the supporting structure is a hollow frame structure, and the circuit board is supported by the hollow frame structure. The first perforation of the circuit board and a hollow portion of the hollow frame structure are aligned with the second perforation of the elastic element, and aligned with the transparent keycap that is penetrated through the first opening of the of the upper cover. The at least one key function visual information shown on the display panel is visible on the transparent keycap through the hollow portion of the hollow frame structure, the first perforation of the circuit board and the second perforation of the elastic element.

In an embodiment, the second electrode is installed on the circuit board, and the first electrode and the second electrode are aligned with each other and electrically connected with each other, so that the capacitive structure is formed by the first electrode and the second electrode collaboratively.

In an embodiment, the second electrode is a metal line. The metal line is distributed around the first perforation of the circuit board and aligned with the first electrode.

In an embodiment, the metal line is a closed-type ring-shaped metal line, an open-type L-shaped metal line or a closed-type ring-shaped staggered metal line, and the metal line is distributed around the first perforation of the circuit board.

In an embodiment, the first electrode is a metal sheet, a conductive coating, a conductive rubber sheet and/or a conductive rubber sheet containing plural metal particles.

In an embodiment, the transparent keycap includes a skirt part. The skirt part is protruded externally from a lower part of the transparent keycap. The lower part of the transparent keycap is contacted with the elastic element. The first electrode is distributed on a top surface of the skirt part. When the transparent keycap is pressed down, the first electrode is correspondingly moved.

In an embodiment, the key circuit board assembly at least includes a circuit board and a supporting structure. The circuit board includes the first perforation. The key circuit board assembly is arranged between the upper cover and the first electrode. The second electrode is a metal line. The metal line is distributed around the first perforation of the circuit board and aligned with the first electrode.

In an embodiment, the first electrode is a metal sheet, a conductive coating, a conductive rubber sheet and/or a conductive rubber sheet containing plural metal particles.

In an embodiment, the first perforation of the circuit board is aligned with the overlying first opening of the upper cover and the underlying second perforation of the elastic element, and the transparent keycap is penetrated through the first perforation of the circuit board. The at least one key function visual information shown on the display panel under the elastic element is visible on the transparent keycap through the second perforation of the elastic element and the first perforation of the circuit board.

In an embodiment, when the transparent keycap is pressed down, the elastic element is correspondingly moved and subjected to elastic deformation, and the spatial distance between the first electrode and the second electrode is changed. Consequently, the at least one capacitance change value is formed. The key circuit board assembly generates the at least key press information according to the at least one capacitance change value.

In accordance with another aspect of the present invention, a control device with a capacitive-type visual key structure is provided. The control device includes a covering member and a transparent keycap. The covering member includes an accommodation space. The transparent keycap is accommodated within the accommodation space, and exposed outside through a first opening of the upper cover. An elastic element, a first electrode, a key circuit board assembly and a display panel are accommodated within the accommodation space. The elastic element is disposed and attached on the transparent keycap. The first electrode is installed on one of the elastic element and the transparent keycap. The key circuit board assembly includes a second electrode. The first electrode and the second electrode are aligned with each other and electrically connected with each other. A capacitive structure is formed by the first electrode and the second electrode collaboratively. When the transparent keycap is pressed down, the elastic element is correspondingly moved, and a spatial distance between the first electrode and the second electrode is changed. Consequently, at least one capacitance change value is formed. The key circuit board assembly generates at least key press information according to the at least one capacitance change value. The display panel is aligned with a first perforation of the key circuit board assembly and the transparent keycap. The control device provides at least one key function visual information to the display panel, and the at least one key function visual information is visible through the transparent keycap.

In an embodiment, the elastic element includes a second perforation, and the second perforation is aligned with the transparent keycap that is exposed outside the first opening of the upper cover. The at least one key function visual information shown on the display panel is visible on the transparent keycap through the second perforation of the elastic element.

In an embodiment, the first electrode is distributed and disposed on at least a part of one of a first surface region and a second surface region of the elastic element. The elastic element is arranged between the upper cover and the key circuit board assembly. The first surface region of the elastic element is located beside the upper cover. The second surface region of the elastic element is located beside the key circuit board assembly.

In an embodiment, the key circuit board assembly at least includes a circuit board and a supporting structure. The circuit board includes the first perforation. The circuit board with the first perforation is located beside the second surface region of the elastic element. The key circuit board assembly is located over the display panel.

In an embodiment, the second electrode is installed on the circuit board, and the first electrode and the second electrode are aligned with each other and electrically connected with each other. Consequently, the capacitive structure is formed by the first electrode and the second electrode collaboratively.

In an embodiment, the first electrode is a metal sheet, a conductive coating, a conductive rubber sheet and/or a conductive rubber sheet containing plural metal particles.

In an embodiment, the transparent keycap includes a skirt part. The skirt part is protruded externally from a lower part of the transparent keycap. The lower part of the transparent keycap is contacted with the elastic element. The first electrode is distributed on a top surface of the skirt part. When the transparent keycap is pressed down, the first electrode is correspondingly moved.

In an embodiment, the key circuit board assembly at least includes a circuit board and a supporting structure. The circuit board includes the first perforation. The key circuit board assembly is arranged between the upper cover and the first electrode. The second electrode is a metal line. The metal line is distributed around the first perforation of the circuit board and aligned with the first electrode.

In an embodiment, the first perforation of the circuit board is aligned with the overlying first opening of the upper cover and the underlying second perforation of the elastic element, and the transparent keycap is penetrated through the first perforation of the circuit board. The at least one key function visual information shown on the display panel under the elastic element is visible on the transparent keycap through the second perforation of the elastic element and the first perforation of the circuit board.

In an embodiment, when the transparent keycap is pressed down, the elastic element is correspondingly moved and subjected to elastic deformation, and the spatial distance between the first electrode and the second electrode is changed. Consequently, the at least one capacitance change value is formed. The key circuit board assembly generates the at least key press information according to the at least one capacitance change value.

In an embodiment, the main control board is electrically connected with the key circuit board assembly and the display panel. The main control board issues the at least one key function visual information to the display panel. The at least one key function visual information is visible through the transparent keycap. The main control board generates and outputs the at least one key function control command according to the at least key press information.

In accordance with another aspect of the present invention, a control device with a capacitive-type visual key structure is provided. The control device includes a covering member, a transparent and elastic keycap, a first electrode, a circuit control assembly and a display panel. The transparent and elastic keycap is exposed outside through a first opening of the upper cover. The first electrode is installed on the transparent and elastic keycap. The circuit control assembly has a second electrode. The first electrode and the second electrode are aligned with each other and electrically connected with each other. In addition, a capacitive structure is formed by the first electrode and the second electrode collaboratively. When the transparent and elastic keycap is pressed down, the elastic element is correspondingly moved, and a spatial distance between the first electrode and the second electrode is changed. Consequently, at least one capacitance change value is formed. The circuit control assembly generates at least key press information according to the at least one capacitance change value. The display panel is electrically connected with the circuit control assembly and aligned with the transparent and elastic keycap. The circuit control assembly issues at least one key function visual information to the display panel. The at least one key function visual information is visible through the transparent and elastic keycap.

In an embodiment, the covering member at least includes an upper cover and a lower cover, which are combined together. An accommodation space is defined by the upper cover and the lower cover collaboratively. The transparent and elastic keycap, the first electrode, the key circuit board assembly with the second electrode and the display panel are accommodated and disposed within the accommodation space.

In an embodiment, the covering member further includes an inner cover, and the inner cover is arranged between the upper cover and the lower cover. The inner cover is located beside an inner side of the upper cover. The inner cover includes a second opening corresponding to the first opening of the upper cover. The transparent keycap is penetrated through the second opening of the inner cover and the first opening of the upper cover and exposed outside.

In an embodiment, the transparent and elastic keycap at least includes a transparent keycap and an elastic element. The transparent keycap is exposed outside through the first opening of the upper cover. The elastic element is installed and attached on the transparent keycap.

In an embodiment, the elastic element includes a second perforation, and the second perforation is aligned with the transparent keycap that is exposed outside the first opening of the upper cover. The at least one key function visual information shown on the display panel is visible on the transparent keycap through the second perforation of the elastic element.

In an embodiment, the first electrode is distributed and disposed on at least a part of one of a first surface region and a second surface region of the elastic element. The elastic element is arranged between the upper cover and the circuit control assembly. The first surface region of the elastic element is located beside the upper cover. The second surface region of the elastic element is located beside the circuit control assembly.

In an embodiment, the circuit control assembly at least includes a circuit board and a supporting structure. The circuit board includes a first perforation. The circuit board with the first perforation is located beside the second surface region of the elastic element. The circuit board and the supporting structure are located over the display panel.

In an embodiment, the second electrode is installed on the circuit board, and the first electrode and the second electrode are aligned with each other and electrically connected with each other. Consequently, the capacitive structure is formed by the first electrode and the second electrode collaboratively.

In an embodiment, the first electrode is a metal sheet, a conductive coating, a conductive rubber sheet and/or a conductive rubber sheet containing plural metal particles.

In an embodiment, the transparent keycap includes a skirt part. The skirt part is protruded externally from a lower part of the transparent keycap. The lower part of the transparent keycap is contacted with the elastic element. The first electrode is distributed on a top surface of the skirt part. When the transparent keycap is pressed down, the first electrode is correspondingly moved.

In an embodiment, the circuit control assembly at least includes a circuit board and a supporting structure. The circuit board includes the first perforation. The circuit control assembly is arranged between the upper cover and the first electrode. The second electrode is a metal line. The metal line is distributed around the first perforation of the circuit board and aligned with the first electrode.

In an embodiment, the first perforation of the circuit board is aligned with the overlying first opening of the upper cover and the underlying second perforation of the elastic element, and the transparent keycap is penetrated through the first perforation of the circuit board. The at least one key function visual information shown on the display panel under the elastic element is visible on the transparent keycap through the second perforation of the elastic element and the first perforation of the circuit board.

In an embodiment, when the transparent keycap is pressed down, the elastic element is correspondingly moved and subjected to elastic deformation. Consequently, a spatial distance between the first electrode and the second electrode is changed, and at least one capacitance change value is formed. The circuit board generates the at least key press information according to the at least one capacitance change value.

In an embodiment, the circuit control assembly further includes a main control board. When the transparent keycap is pressed down, the elastic element is correspondingly moved and subjected to elastic deformation. Consequently, a spatial distance between the first electrode and the second electrode is changed, and at least one capacitance change value is formed. Moreover, at least one of the key circuit board assembly and the main control board generates the at least key press information according to the at least one capacitance change value.

In an embodiment, the main control board is electrically connected with the key circuit board assembly and the display panel. The main control board issues the at least one key function visual information to the display panel. The at least one key function visual information is visible through the transparent keycap. The at least key press information is inputted into the main control board. The main control board generates and outputs at least one key function control command according to the at least key press information.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

The present invention provides a control device with a capacitive-type visual key structure. Hereinafter, some embodiments of the control device will be described. The mechanism of the capacitive-type visual key structure is specially designed. Firstly, a transparent keycap is produced by a soft glue technology. Consequently, each transparent keycap can present a variety of image changes through the underlying display panel. Moreover, the transparent keycap and an elastic element cooperate to implement an elastic press stroke. In accordance with the sensing control design of the control device, a first approach uses a first electrode (or any other electrode material capable of changing the capacitance value), and another approach forms a second electrode (or any other electrode material capable of changing the capacitance value) on layout traces of the circuit board (e.g., Flex or PCBA). By detecting the change of the spatial distance between the first electrode and the second electrode in the elastic press stroke, the change of the capacitance value can be sensed. Moreover, the control device judges whether the key structure has been triggered. The concepts of changing the distance between the electrodes to adjust the capacitance value change are not restricted. It is noted that numerous modifications and alterations may be made while retaining the teachings of the invention.

In the various embodiments of the control device with the capacitive-type visual key structure, the control device is a live streaming control device or a live production switcher. It is noted that the application fields of the control device are not restricted.

Figure 1A:
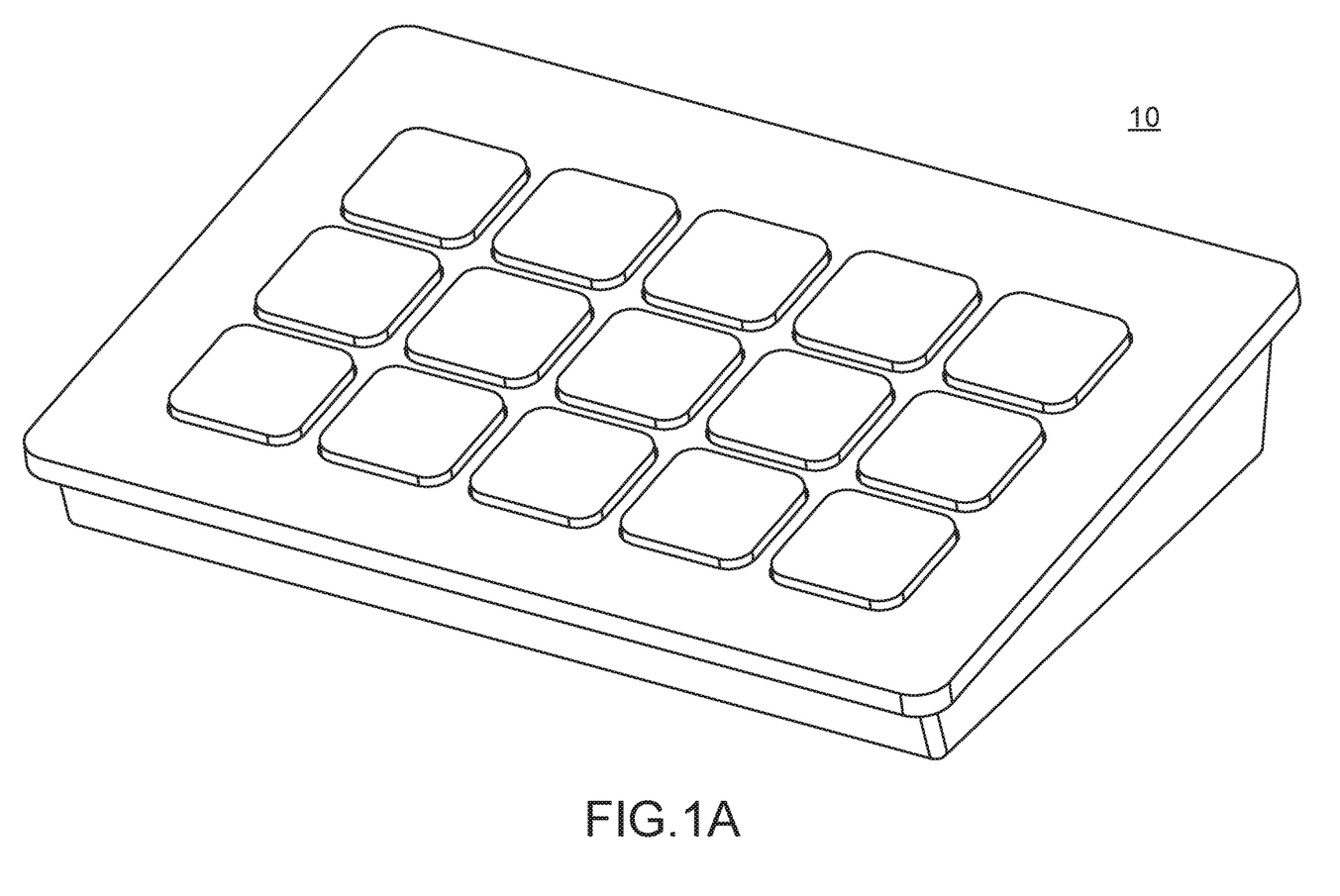
FIG. 1A is a schematic perspective view illustrating a control device with a capacitive-type visual key structure according to a first embodiment of the present invention.
Figure 1B:
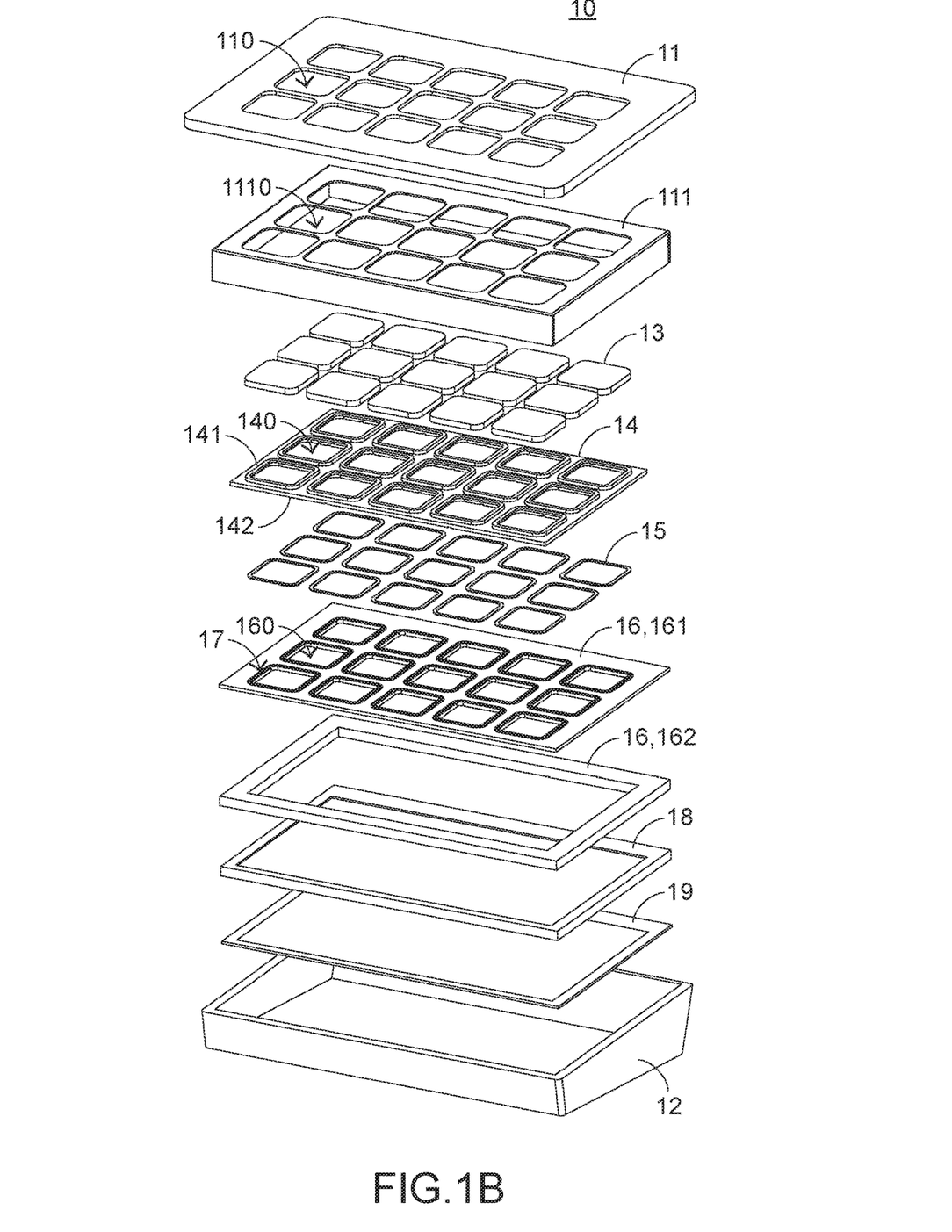
FIG. 1B is a schematic exploded view illustrating the components of the control device as shown in FIG. 1A.

Please refer to FIG. 1A and FIG. 1B. FIG. 1A is a schematic perspective view illustrating a control device with a capacitive-type visual key structure according to a first embodiment of the present invention. FIG. 1B is a schematic exploded view illustrating the components of the control device as shown in FIG. 1A.

As shown in FIG. 1A and FIG. 1B, the control device 10 of the first embodiment at least comprises a covering member, at least one transparent keycap 13, an elastic element 14, at least one first electrode 15, a key circuit board assembly 16, a display panel 18 and a main control board 19. The covering member at least comprises an upper cover 11 and a lower cover 12, which are combined together. The at least one transparent keycap 13 is penetrated through at least one first opening 110 of the upper cover 11 and exposed outside. The elastic element 14 is disposed and attached on the at least one transparent keycap 13. The at least one first electrode 15 is combined with the elastic element 14. The key circuit board assembly 16 comprises at least one second electrode 17. The first electrode 15 and the second electrode 17 are aligned with each other and electrically connected with each other. Consequently, a capacitive structure is formed by the first electrode 15 and the second electrode 17 collaboratively. When the transparent keycap 13 is pressed down, the elastic element 14 is correspondingly moved. Consequently, the spatial distance between the first electrode 15 and the second electrode 17 is changed, and at least one capacitance change value is formed. According to the at least one capacitance change value, the key circuit board assembly 16 correspondingly generates at least key press information. The display panel 18 is aligned with at least one first perforation 160 of the key circuit board assembly 16 and the at least one transparent keycap 13. The main control board 19 is electrically connected with the key circuit board assembly 16 and the display panel 18. The main control board 19 issues at least one key function visual information to the display panel 18. Consequently, the at least one key function visual information is visible through the at least one transparent keycap 13. In addition, the at least key press information is inputted into the main control board 19. According to the at least key press information, the main control board 19 generates and outputs at least one key function control command.

In an embodiment, the covering member further comprises an inner cover 111. The inner cover 111 is arranged between the upper cover 11 and the lower cover 12. As shown in FIG. 1B, the inner cover 111 is located beside the inner side of the upper cover 11. The inner cover 111 comprises at least one second opening 1110 corresponding to the at least one first opening 110 of the upper cover 11. Moreover, the at least one transparent keycap 13 is penetrated through the at least one second opening 1110 of the inner cover 111 and the at least one first opening 110 of the upper cover 11 and exposed outside.

In this embodiment, the upper cover 11 and the inner cover 111 are two individual components. It is noted that numerous modifications and alterations may be made while retaining the teachings of the invention. For example, in another embodiment, the inner cover is omitted. Alternatively, the upper cover 11 and the inner cover 111 are integrated into a one-piece structure.

In an embodiment, an accommodation space is defined by the upper cover 11 and the lower cover 12 collaboratively. In addition, the at least one transparent keycap 13, the elastic element 14, the at least one first electrode 15, the key circuit board assembly 16, the display panel 18 and the main control board 19 are accommodated and disposed within the accommodation space.

In an embodiment, the elastic element 14 has at least one second perforation 140. The second perforation 140 is aligned with the corresponding transparent keycap 13, which is exposed outside the corresponding first opening 110 of the upper cover 11. The at least one key function visual information shown on the display panel 18 is visible on the corresponding transparent keycap 13 through the corresponding second perforation 140 of the elastic element 14.

The at least one transparent keycap 13 includes one or plural transparent keycaps 13. Correspondingly, the at least one first opening 110 of the upper cover 11 includes one or plural first openings 110. In the embodiment of FIGS. 1A and 1B, the control device comprises 15 transparent keycaps 13. It is noted that the number of the transparent keycaps 13 is not restricted. Moreover, the transparent keycaps 13 are made of a light-transmissible transparent plastic material. The number of the at least one first perforation 160 of the key circuit board assembly 16 and the number of the at least one second perforation 140 of the elastic element 14 are determined according to the number of the at least one transparent keycap 13. That is, the at least one first perforation 160 of the key circuit board assembly 16 includes one or plural first perforations 160, and the at least one second perforation 140 of the elastic element 14 includes one or plural second perforations 140.

The elastic element 14 comprises a first surface region (or a top surface region) 141 and a second surface region (or a bottom surface region) 142, which are opposed to each other. In accordance with a structural feature of the present invention, the first electrode 15 is distributed and disposed on at least a part of the second surface region (or the bottom surface region) 142, and the elastic element 14 is arranged between the upper cover 11 (and the inner cover 111) and the key circuit board assembly 16. In other words, the first surface region (or the top surface region) 141 of the elastic element 14 is located beside the upper cover 11 (and the inner cover 111), and the second surface region (or the bottom surface region) 142 of the elastic element 14 is located beside the key circuit board assembly 16.

In an embodiment, the first electrode 15 is distributed and disposed on the second surface region (or the bottom surface region) 142 and located near the periphery region of the at least one second perforation 140 of the elastic element 14. It is noted that the distribution of the first electrode 15 is not restricted.

In an embodiment, the first electrode 15 is a metal sheet, a conductive coating, a conductive rubber sheet and/or a conductive rubber sheet containing plural metal particles. It is noted that the material of the first electrode 15 is not restricted. For example, any other electrode material capable of changing the capacitance value is suitably used as the first electrode 15.

Preferably but not exclusively, the first electrode 15 is formed on the second surface region (or the bottom surface region) 142 by using a bonding agent or an insert-molding process.

Figure 2A:
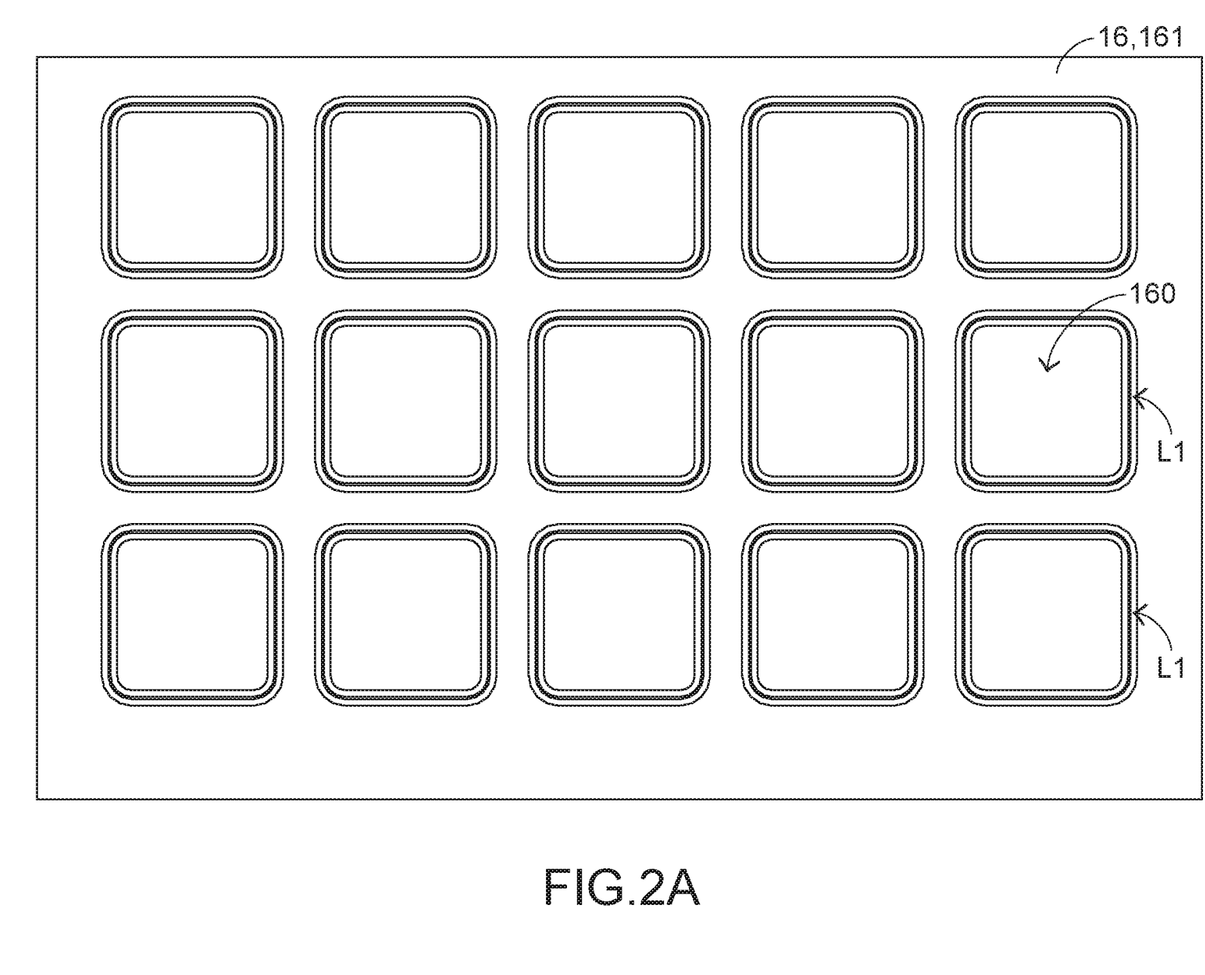
FIG. 2A is a schematic top view illustrating the key circuit board assembly and the at least one second electrode of the control device as shown in FIG. 1B.
Figure 2B:
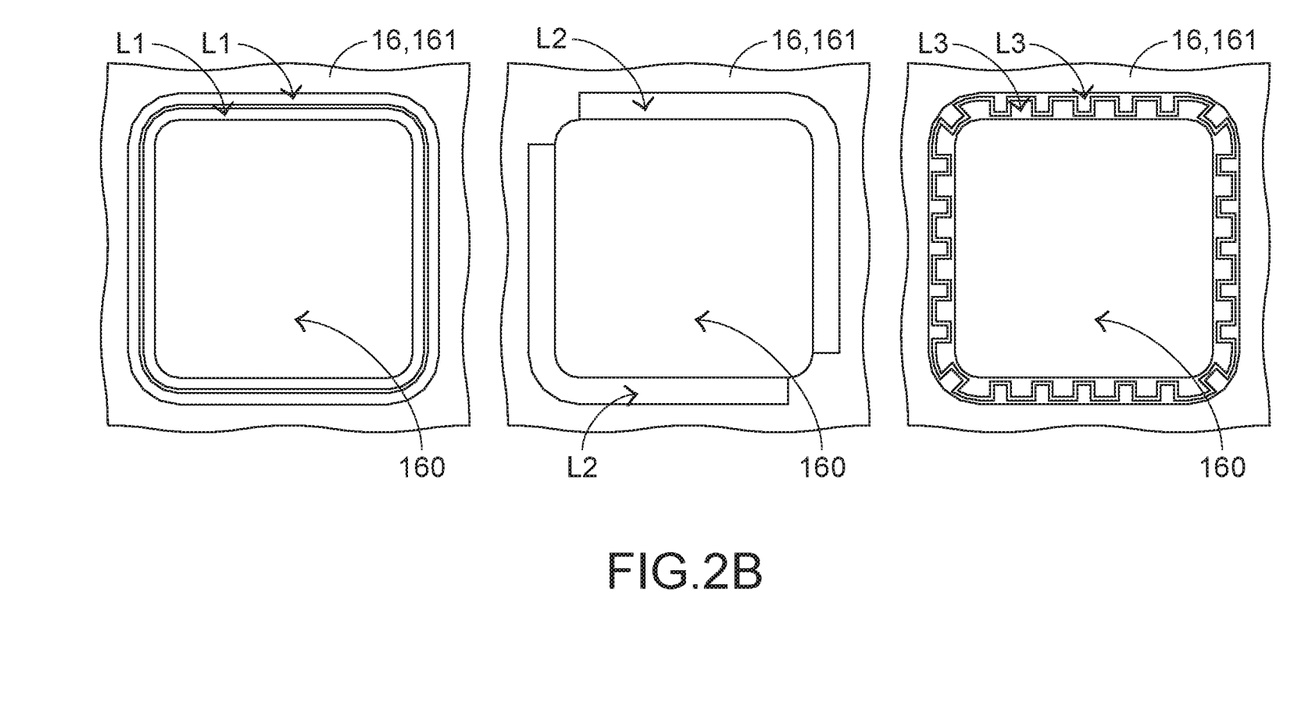
FIG. 2B schematically illustrates three examples of the second electrode of the control device as shown in FIG. 1B.
Figure 3:
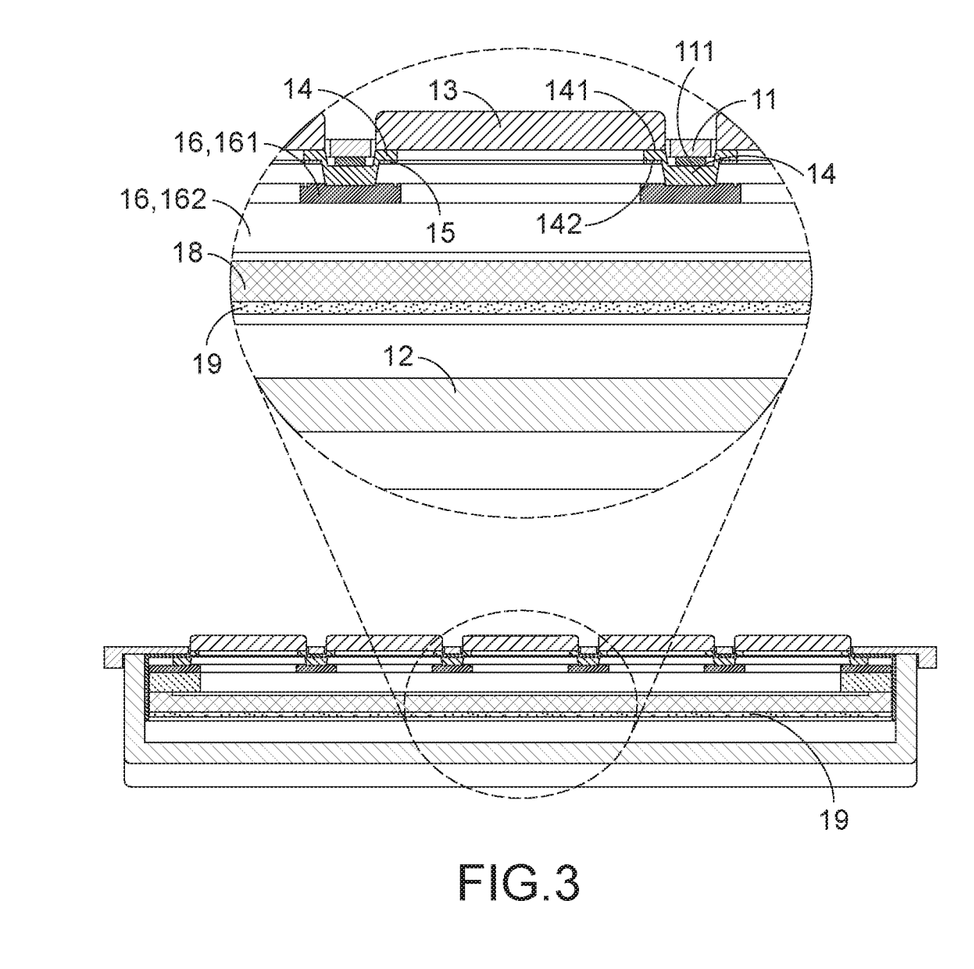
FIG. 3 is a schematic cross-sectional view illustrating the control device as shown in FIG. 1A and an enlarged portion of the control device.

Please refer to FIGS. 2A, 2B and 3. FIG. 2A is a schematic top view illustrating the key circuit board assembly 16 and the at least one second electrode 17 of the control device as shown in FIG. 1B. FIG. 2B schematically illustrates three examples of the second electrode of the control device as shown in FIG. 1B. FIG. 3 is a schematic cross-sectional view illustrating the control device as shown in FIG. 1A and an enlarged portion of the control device.

In accordance with another structural feature of the first embodiment, the key circuit board assembly 16 at least comprises a circuit board 161 and a supporting structure 162. The circuit board 161 comprises the at least one first perforation 160. The circuit board 161 with the at least one first perforation 160 is located beside the second surface region (or the bottom surface region) 142 of the elastic element 14. Moreover, the key circuit board assembly 16 is located beside (or located over) the display panel 18.

In an embodiment, the supporting structure 162 is a hollow frame structure for supporting the circuit board 161. The at least one first perforation 160 of the circuit board 161 and the hollow portion of the hollow frame structure 162 are aligned with the at least one second perforation 140 of the elastic element 14. In addition, the at least one first perforation 160 of the circuit board 161 and the hollow portion of the hollow frame structure 162 are aligned with the corresponding transparent keycap 13, which is exposed outside the corresponding first opening 110 of the upper cover 11. Consequently, the at least one key function visual information shown on the display panel 18 is visible on the corresponding transparent keycap 13 through the hollow portion of the hollow frame structure 162, the corresponding first perforation 160 of the circuit board 161 and the corresponding second perforation 140 of the elastic element 14.

In another embodiment, the supporting structure 162 is omitted according to the practical requirements.

Please refer to FIGS. 1B, 2A and 2B again. The second electrode 17 is installed on the circuit board 161. The first electrode 15 and the second electrode 17 are aligned with each other and electrically connected with each other. Consequently, a capacitive structure is formed by the first electrode 15 and the second electrode 17 collaboratively.

In an embodiment, the second electrode 17 is a metal line (or a metal pad). The metal line is a closed-type ring-shaped metal line L1, an open-type L-shaped metal line L2 or a closed-type ring-shaped staggered metal line L3. The metal line is distributed around the first perforation 160 of the circuit board 161 and aligned with the first electrode 15. It is noted that the example of the metal line 17 is not restricted.

As can be seen from the cross-sectional view of FIG. 3, the first electrode 15 is distributed and installed on at least a part of the second surface region (or the bottom surface region) 142 of the elastic element 14. In addition, the first electrode 15 and the second electrode 17 on the circuit board 161 are aligned with each other and separated from each other by a spatial distance (or separated from each other by the height of the elastic element). When the transparent keycap 13 is pressed down, the elastic element 14 is correspondingly moved, and the elastic element 14 is subjected to elastic deformation. Consequently, the spatial distance between the first electrode 15 and the second electrode 17 is changed (or the height of the elastic element is changed), and at least one capacitance change value is formed. Consequently, the spatial distance between the first electrode 15 and the second electrode 17 is changed, and at least one capacitance change value is formed. According to the at least one capacitance change value, the key circuit board assembly 16 correspondingly generates at least key press information (e.g., a press-down key information).

When the transparent keycap 13 is released, the elastic element 14 is correspondingly moved. The elastic element 14 is restored from the elastic deformation state. Consequently, the distance between the first electrode 15 and the second electrode 17 is restored to its original distance (or restored to its original height of the elastic element). During the restoring process, an additional capacitance change value is formed. Optionally, according to the additional capacitance change value, the key circuit board assembly 16 generates another key press information (e.g., a release key information).

The control device of the present invention comprises plural transparent keycaps 13. For succinctness, a single transparent keycap 13 will be described. After the transparent keycap 13 is sequentially pressed down and released, the elastic element 14 is correspondingly moved, and the distance between the first electrode 15 and the second electrode 17 is correspondingly changed. Consequently, the capacitance change value and the additional capacitance change value are sequentially formed. The consecutive process of generating the capacitance change value and the additional capacitance change value can be considered as a touch control process of a single key. Consequently, among plural keys, the main control board 19 can easily recognize which key is triggered to perform the touch control process and recognize the other keys.

As mentioned above, the first electrode 15 and the second electrode 17 are aligned with each other and electrically connected with each other, and thus a capacitive structure is formed by the first electrode 15 and the second electrode 17 collaboratively. Due to this structural design, the operation mode of the transparent keycap 13 can be switched between a touch control mode and a non-touch control mode. In the touch control mode, the pressing signal is generated. In the non-touch control mode, the pressing signal is not generated. Consequently, more intermediate modes between the touch control mode and the non-touch control mode can be provided to expand the applications. For example, if the extent of pressing down the transparent keycap 13 has not reached ½ or ⅓ of the pressing stroke, an expanded key press information (e.g., a ready-to-press key information) is generated.

As mentioned above, the capacitive structure is formed by the first electrode 15 and the second electrode 17 collaboratively. Due to the capacitive structure, the response sensitivity of pressing the transparent keycap 13 is enhanced. The operating mode can be easily adjusted according to the user's habit or application field. In other words, the flexibility and application of using the control device are enhanced.

In this embodiment, the transparent keycap 13, the elastic element 14, the first electrode 15 and the key circuit board assembly 16 with the second electrode 17 (i.e., the circuit board and the supporting structure) are main components of the capacitive-type visual key structure.

In an embodiment, the transparent keycap 13 and the elastic element 14 are individual components. In another embodiment, the transparent keycap 13 and the elastic element 14 are integrally formed or assembled as a one-piece structure. For example, the transparent keycap 13 and the elastic element 14 are integrated as a transparent and elastic keycap.

In the above embodiment, the at least key press information is generated by the key circuit board assembly 16 according to the at least one capacitance change value. It is noted that numerous modifications and alterations may be made while retaining the teachings of the invention. For example, in another embodiment, the at least key press information is generated by the main control board 19.

In an embodiment, the main control board 19 and the key circuit board assembly 16 are implemented with two individual boards. It is noted that numerous modifications and alterations may be made while retaining the teachings of the invention. For example, in another embodiment, the main control board 19 and the key circuit board assembly 16 are integrally formed or assembled as a circuit control assembly. In addition, the functions of the main control board 19 and the key circuit board assembly 16 are integrated into the circuit control assembly.

Figure 4A:
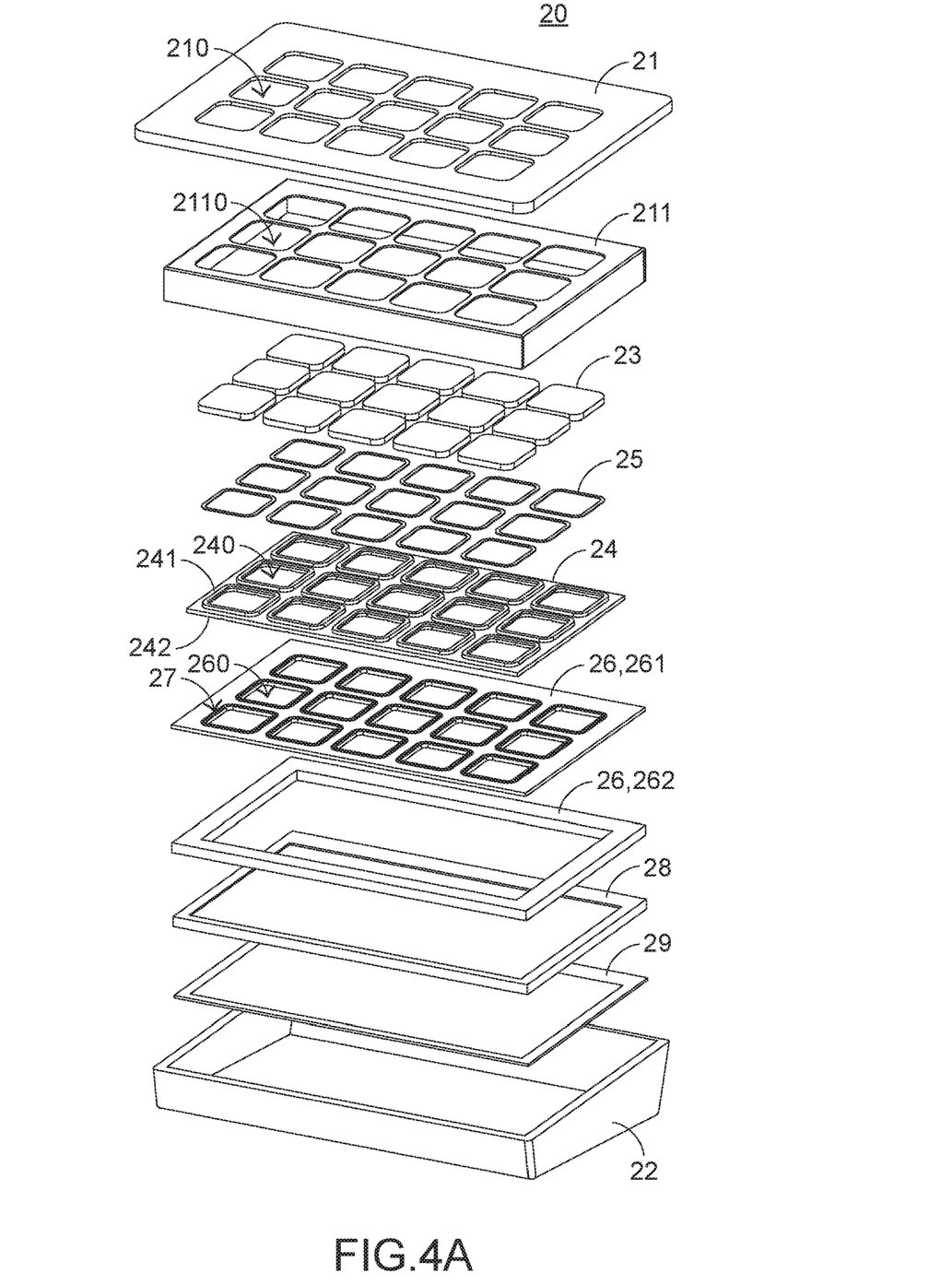
FIG. 4A is a schematic exploded view illustrating a control device with a capacitive-type visual key structure according to a second embodiment of the present invention.
Figure 4B:
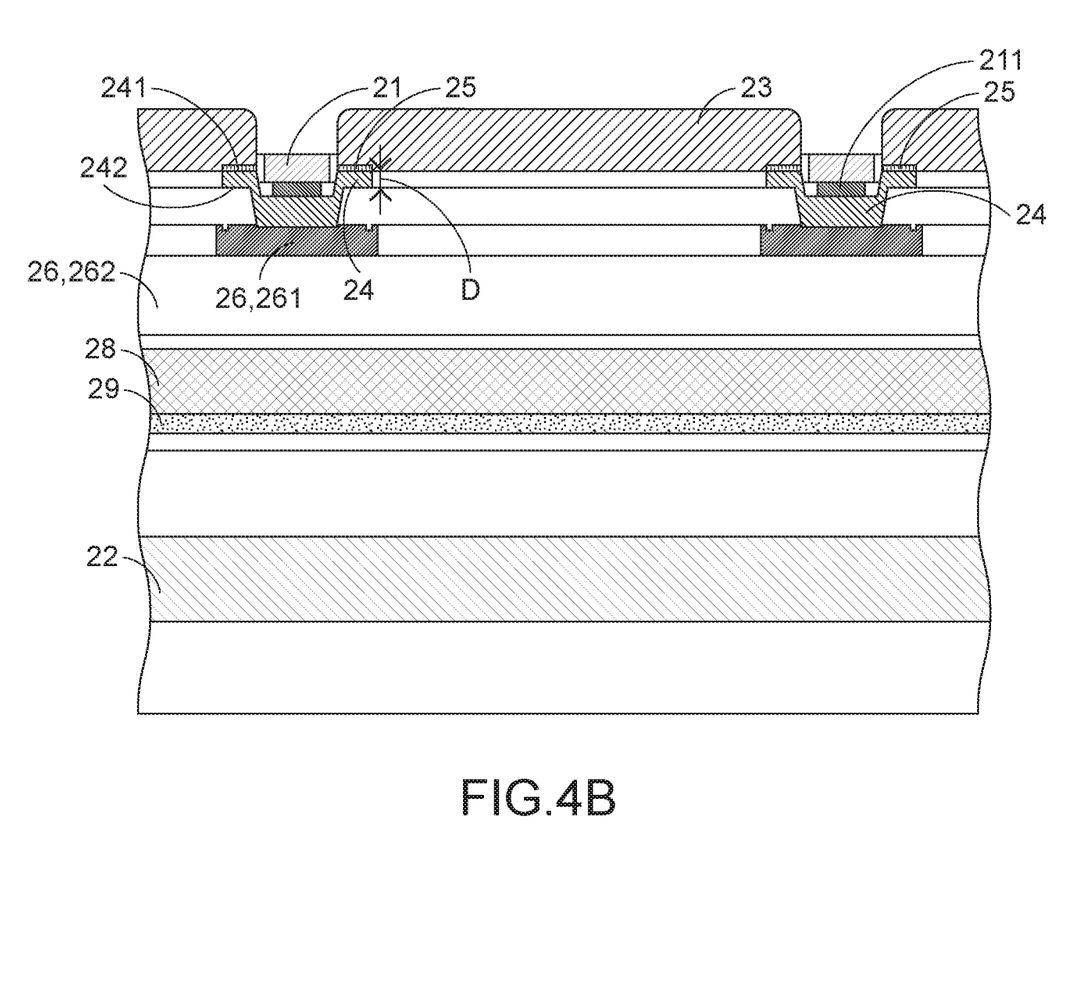
FIG. 4B is a schematic cross-sectional view illustrating a portion of the control device as shown in FIG. 1A.

Please refer to FIG. 4A and FIG. 4B. FIG. 4A is a schematic exploded view illustrating a control device with a capacitive-type visual key structure according to a second embodiment of the present invention. FIG. 4B is a schematic cross-sectional view illustrating a portion of the control device as shown in FIG. 1A.

The control device 20 of the second embodiment at least comprises a covering member, at least one transparent keycap 23, an elastic element 24, at least one first electrode 25, a key circuit board assembly 26, a display panel 28 and a main control board 29. The covering member at least comprises an upper cover 21 and a lower cover 22, which are combined together. The at least one transparent keycap 23 is penetrated through at least one first opening 210 of the upper cover 21 and exposed outside. The elastic element 24 is disposed and attached on the at least one transparent keycap 23. The at least one first electrode 25 is combined with the elastic element 24. The key circuit board assembly 26 comprises at least one second electrode 27. The first electrode 25 and the second electrode 27 are aligned with each other and electrically connected with each other. Consequently, a capacitive structure is formed by the first electrode 25 and the second electrode 27 collaboratively. When the transparent keycap 23 is pressed down, the elastic element 24 is correspondingly moved. Consequently, the spatial distance between the first electrode 25 and the second electrode 27 is changed, and at least one capacitance change value is formed. According to the at least one capacitance change value, the key circuit board assembly 26 correspondingly generates at least key press information. The display panel 28 is aligned with at least one first perforation 260 of the key circuit board assembly 26 and the at least one transparent keycap 23. The main control board 29 is electrically connected with the key circuit board assembly 26 and the display panel 28. The main control board 19 issues at least one key function visual information to the display panel 28. Consequently, the at least one key function visual information is exposed through the at least one transparent keycap 23. In addition, the at least key press information is inputted into the main control board 29. According to the at least key press information, the main control board 29 generates and outputs at least one key function control command.

In an embodiment, the covering member further comprises an inner cover 211. The inner cover 211 is arranged between the upper cover 21 and the lower cover 22. As shown in FIG. 4A, the inner cover 211 is located beside the inner side of the upper cover 21. The inner cover 211 comprises at least one second opening 2110 corresponding to the at least one first opening 210 of the upper cover 21. Moreover, the at least one transparent keycap 23 is penetrated through the at least one second opening 2110 of the inner cover 211 and the at least one first opening 210 of the upper cover 21 and exposed outside.

Similarly, the key circuit board assembly 26 at least comprises a circuit board 261 and a supporting structure 262. The circuit board 261 comprises the at least one first perforation 260.

The components and functions of the control device of the second embodiment as shown in FIGS. 4A and 4B are similar to those of the control device of the first embodiment as shown in FIGS. 1B and 3. Similarly, the elastic element 24 comprises a first surface region (or a top surface region) 241 and a second surface region (or a bottom surface region) 242, which are opposed to each other. In comparison with the control device of the first embodiment as shown in FIGS. 1B and 3, the distribution of the first electrode 25 in the control device of the second embodiment as shown in FIGS. 4A and 4B is varied. In this embodiment, the first electrode 25 is installed on at least a part of the first surface region (or the top surface region) 241. In addition, the elastic element 24 is arranged between the upper cover 21 (and the inner cover 211) and the key circuit board assembly 26. In other words, the first surface region (or the top surface region) 241 of the elastic element 24 is located beside the upper cover 21 (and the inner cover 211), and the second surface region (or the bottom surface region) 242 of the elastic element 24 is located beside the key circuit board assembly 26.

In an embodiment, the first electrode 25 is distributed and disposed on the first surface region 241 and located near the periphery region of the at least one second perforation 240 of the elastic element 24. It is noted that the distribution of the first electrode 25 is not restricted.

In the control device of the second embodiment as shown in FIGS. 4A and 4B, the first electrode 25 and the second electrode 27 are separated from each other by a layer of elastic element. In case that the thickness D of the part of the elastic element corresponding to the first electrode 25 and the second electrode 27 is too large, the capacitive effect is adversely affected. Consequently, it is necessary that the elastic element corresponding to the first electrode 25 and the second electrode 27 is not too thick.

Figure 5:
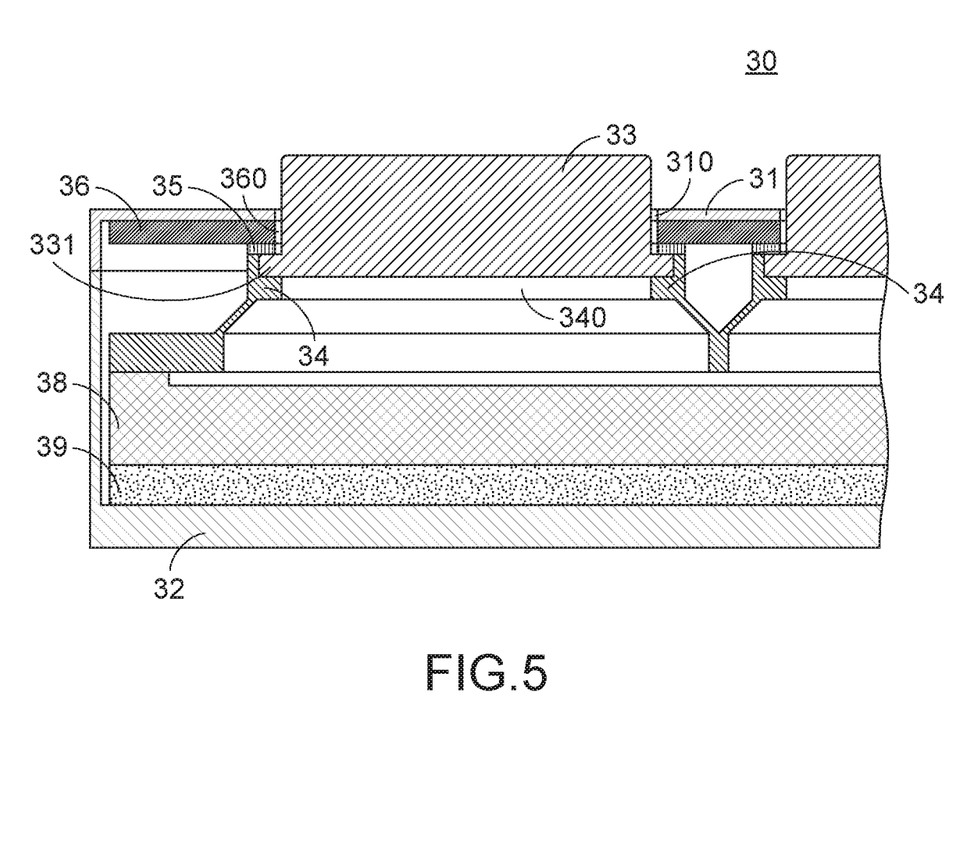
FIG. 5 is a schematic cross-sectional view illustrating a control device with a capacitive-type visual key structure according to a third embodiment of the present invention.

FIG. 5 is a schematic cross-sectional view illustrating a control device with a capacitive-type visual key structure according to a third embodiment of the present invention.

As shown in FIG. 5, the control device 30 of the third embodiment at least comprises a covering member, at least one transparent keycap 33, an elastic element 34, at least one first electrode 35, a key circuit board assembly 36, a display panel 38 and a main control board 39. The covering member at least comprises an upper cover 31 and a lower cover 32, which are combined together. The at least one transparent keycap 33 is penetrated through at least one first opening 310 of the upper cover 31 and exposed outside. The elastic element 34 is disposed and attached on the at least one transparent keycap 33. The key circuit board assembly 36 comprises at least one second electrode (not shown). The second electrode is similar to the second electrode of the control device in the above embodiments. The first electrode 35 and the second electrode are aligned with each other and electrically connected with each other. Consequently, a capacitive structure is formed by the first electrode 35 and the second electrode collaboratively. When the transparent keycap 33 is pressed down, the elastic element 34 is correspondingly moved. Consequently, the spatial distance between the first electrode 35 and the second electrode is changed, and at least one capacitance change value is formed. According to the at least one capacitance change value, the key circuit board assembly 36 correspondingly generates at least key press information. The display panel 38 is aligned with at least one first perforation 360 of the key circuit board assembly 36 and the at least one transparent keycap 33. The main control board 39 is electrically connected with the key circuit board assembly 36 and the display panel 38. The main control board 39 issues at least one key function visual information to the display panel 38. Consequently, the at least one key function visual information is visible through the at least one transparent keycap 33. In addition, the at least key press information is inputted into the main control board 39. According to the at least key press information, the main control board 39 generates and outputs at least one key function control command.

As shown in FIG. 5, the control device 30 of the third embodiment at least comprises a covering member, at least one transparent keycap 33, an elastic element 34, at least one first electrode 35, a key circuit board assembly 36, a display panel 38 and a main control board 39. The covering member at least comprises an upper cover 31 and a lower cover 32, which are combined together. The at least one transparent keycap 33 is penetrated through at least one first opening 310 of the upper cover 31 and exposed outside. The elastic element 34 is disposed and attached on the at least one transparent keycap 33. The key circuit board assembly 36 comprises at least one second electrode (not shown). The second electrode is similar to the second electrode of the control device in the above embodiments. The first electrode 35 and the second electrode are aligned with each other and electrically connected with each other. Consequently, a capacitive structure is formed by the first electrode 35 and the second electrode collaboratively. When the transparent keycap 33 is pressed down, the elastic element 34 is correspondingly moved. Consequently, the spatial distance between the first electrode 35 and the second electrode is changed, and at least one capacitance change value is formed. According to the at least one capacitance change value, the key circuit board assembly 36 correspondingly generates at least key press information. The display panel 38 is aligned with at least one first perforation 360 of the key circuit board assembly 36 and the at least one transparent keycap 33. The main control board 39 is electrically connected with the key circuit board assembly 36 and the display panel 38. The main control board 39 issues at least one key function visual information to the display panel 38. Consequently, the at least one key function visual information is visible through the at least one transparent keycap 33. In addition, the at least key press information is inputted into the main control board 39. According to the at least key press information, the main control board 39 generates and outputs at least one key function control command.

The components and functions of the control device of the third embodiment as shown in FIG. 5 are similar to those of the control device of the first embodiment as shown in FIGS. 1B and 3. In comparison with the control device of the first embodiment as shown in FIGS. 1B and 3, the first electrode 35 in the control device of the third embodiment is combined with the transparent keycap 33. In this embodiment, the transparent keycap 33 comprises a skirt part 331. The skirt part 331 is protruded externally from a lower part of the transparent keycap 33. Moreover, the lower part of the transparent keycap 33 is contacted with the elastic element 34. The first electrode 35 is distributed on the top surface of the skirt part 331. Consequently, when the transparent keycap 33 is pressed down, the first electrode 35 is correspondingly moved.

Preferably but not exclusively, the first electrode 35 is formed on the top surface of the skirt part 331 of the transparent keycap 33 by using a bonding agent or an insert-molding process. In addition, the key circuit board assembly 36 is located over the elastic element 34. When the transparent keycap 33 is pressed down for a displacement, the spatial distance between the first electrode 35 (i.e., on the top surface of the skirt part 331 of the transparent keycap 33) and the second electrode 37 (i.e., on the key circuit board assembly 36) is changed (or increased), and a capacitance change value is formed. According to the capacitance change value, it is judged that the transparent keycap 33 has been pressed down and triggered.

When the transparent keycap 13 is released, the elastic element 34 is correspondingly moved and returned to its original position. Consequently, the distance between the first electrode 35 and the second electrode 37 on the key circuit board assembly 36 is restored to its original distance. During the restoring process, an additional capacitance change value is formed. According to the additional capacitance change value, it is judged that the transparent key has been released.

In this embodiment, the elastic element 34 has at least one second perforation 340. The second perforation 340 is aligned with the corresponding transparent keycap 33, which is exposed outside the corresponding first opening 310 of the upper cover 31. The first perforation 360 of the key circuit board assembly 36 is aligned with the overlying first opening 310 of the upper cover 31 and the underlying second perforation 340 of the elastic element 34. The transparent keycap 33 is penetrated through the first perforation 360 of the key circuit board assembly 36. The at least one key function visual information shown on the display panel 38 under the elastic element 34 is visible on the transparent keycap 33 through the second perforation 340 of the elastic element 34 and the first perforation 360 of the key circuit board assembly 36.

As mentioned above, the first electrode and the second electrode are aligned with each other and electrically connected with each other, and thus a capacitive structure is formed by the first electrode and the second electrode collaboratively. Consequently, the capacitance change value can be sensed. According to the capacitance change value, the control device judges whether the transparent keycap has been pressed down and triggered. As a consequence, the applications of the control device are increased when compared with the conventional control device. In the conventional touch type key structure, the pressing result of the key structure is acquired after the contact area or the bump is contacted with the corresponding electrode. In accordance with the technology of the present invention, the pressing signal is generated when the capacitance change value reaches a certain level. Moreover, in a longer press stroke, more intermediate modes between the touch control mode and the non-touch control mode can be provided to expand the function and applications (e.g., a function of judging whether the key structure is in the ready-to-press state). Moreover, different distance changes of the key press stroke can enable different functions, and thus the function similar to the force sensor is achieved. In other words, the technologies of the present invention are industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A control device with a capacitive-type visual key structure, the control device comprising:
   a covering member at least comprising an upper cover and a lower cover, which are combined together;
   a transparent keycap exposed outside through a first opening of the upper cover;
   an elastic element attached on the transparent keycap;
   a first electrode installed on the elastic element;
   a key circuit board assembly with a second electrode, wherein the first electrode and the second electrode are aligned with each other and electrically connected with each other, so that a capacitive structure is formed by the first electrode and the second electrode collaboratively, wherein when the transparent keycap is pressed down, the elastic element is correspondingly moved, and a spatial distance between the first electrode and the second electrode is changed, so that at least one capacitance change value is formed, wherein the key circuit board assembly generates at least key press information according to the at least one capacitance change value;
   a display panel aligned with a first perforation of the key circuit board assembly and the transparent keycap; and
   a main control board electrically connected with the key circuit board assembly and the display panel, wherein the main control board issues at least one key function visual information to the display panel, and the at least one key function visual information is visible through the transparent keycap, wherein the at least key press information is inputted into the main control board, and the main control board generates and outputs at least one key function control command according to the at least key press information;

wherein the elastic element comprises a second perforation;
wherein the first electrode is distributed and disposed on at least a part of one of a first surface region and a second surface region of the elastic element;
wherein the first electrode is distributed on a periphery region of the second perforation of the elastic element;
wherein the elastic element is arranged between the upper cover and the key circuit board assembly, the first surface region of the elastic element is located beside the upper cover, and the second surface region of the elastic element is located beside the key circuit board assembly.

2. The control device according to claim 1, wherein the covering member further comprises an inner cover, and the inner cover is arranged between the upper cover and the lower cover, wherein the inner cover is located beside an inner side of the upper cover, and the inner cover comprises a second opening corresponding to the first opening of the upper cover, wherein the transparent keycap is penetrated through the second opening of the inner cover and the first opening of the upper cover and exposed outside.

3. The control device according to claim 1, wherein the second perforation of the elastic element is aligned with the transparent keycap that is exposed outside the first opening of the upper cover, wherein the at least one key function visual information shown on the display panel is visible on the transparent keycap through the second perforation of the elastic element.

4. The control device according to claim 1, wherein the key circuit board assembly at least comprises a circuit board and a supporting structure, wherein the circuit board comprises the first perforation, the circuit board with the first perforation is located beside the second surface region of the elastic element, and the key circuit board assembly is located over the display panel.

5. The control device according to claim 4, wherein the supporting structure is a hollow frame structure, and the circuit board is supported by the hollow frame structure, wherein the first perforation of the circuit board and a hollow portion of the hollow frame structure are aligned with the second perforation of the elastic element, and aligned with the transparent keycap that is penetrated through the first opening of the of the upper cover, wherein the at least one key function visual information shown on the display panel is visible on the transparent keycap through the hollow portion of the hollow frame structure, the first perforation of the circuit board and the second perforation of the elastic element.

6. The control device according to claim 4, wherein the second electrode is installed on the circuit board, and the first electrode and the second electrode are aligned with each other and electrically connected with each other, so that the capacitive structure is formed by the first electrode and the second electrode collaboratively.

7. The control device according to claim 6, wherein the second electrode is a metal line, wherein the metal line is distributed around the first perforation of the circuit board and aligned with the first electrode.

8. The control device according to claim 7, wherein the metal line is a closed-type ring-shaped metal line, an open-type L-shaped metal line or a closed-type ring-shaped staggered metal line, and the metal line is distributed around the first perforation of the circuit board.

9. The control device according to claim 1, wherein the first electrode is a metal sheet, a conductive coating, a conductive rubber sheet and/or a conductive rubber sheet containing plural metal particles.

10. The control device according to claim 1, wherein when the transparent keycap is pressed down, the elastic element is correspondingly moved and subjected to elastic deformation, and the spatial distance between the first electrode and the second electrode is changed, so that the at least one capacitance change value is formed, wherein the key circuit board assembly generates the at least key press information according to the at least one capacitance change value.

11. A control device with a capacitive-type visual key structure, the control device comprising:
a covering member comprising an accommodation space; and
a transparent keycap accommodated within the accommodation space, and exposed outside through a first opening of an upper cover of the covering member,
wherein an elastic element, a first electrode, a key circuit board assembly and a display panel are accommodated within the accommodation space,
wherein the elastic element is disposed and attached on the transparent keycap, the first electrode is installed on the elastic element, the key circuit board assembly comprises a second electrode, the first electrode and the second electrode are aligned with each other and electrically connected with each other, and a capacitive structure is formed by the first electrode and the second electrode collaboratively, wherein when the transparent keycap is pressed down, the elastic element is correspondingly moved, and a spatial distance between the first electrode and the second electrode is changed, so that at least one capacitance change value is formed, wherein the key circuit board assembly generates at least key press information according to the at least one capacitance change value, wherein the display panel is aligned with a first perforation of the key circuit board assembly and the transparent keycap, wherein the control device provides at least one key function visual information to the display panel, and the at least one key function visual information is visible through the transparent keycap;
wherein the elastic element comprises a second perforation;
wherein the first electrode is distributed and disposed on at least a part of one of a first surface region and a second surface region of the elastic element;
wherein the first electrode is distributed on a periphery region of the second perforation of the elastic element;
wherein the elastic element is arranged between the upper cover and the key circuit board assembly, the first surface region of the elastic element is located beside the upper cover, and the second surface region of the elastic element is located beside the key circuit board assembly.

12. The control device according to claim 11, wherein the second perforation of the elastic element is aligned with the transparent keycap that is exposed outside the first opening of the upper cover, wherein the at least one key function visual information shown on the display panel is visible on the transparent keycap through the second perforation of the elastic element.

13. The control device according to claim 11, wherein the key circuit board assembly at least comprises a circuit board and a supporting structure, wherein the circuit board comprises the first perforation, the circuit board with the first perforation is located beside the second surface region of the elastic element, and the key circuit board assembly is located over the display panel.

14. The control device according to claim 13, wherein the second electrode is installed on the circuit board, and the first electrode and the second electrode are aligned with each other and electrically connected with each other, so that the capacitive structure is formed by the first electrode and the second electrode collaboratively.

15. The control device according to claim 11, wherein the first electrode is a metal sheet, a conductive coating, a conductive rubber sheet and/or a conductive rubber sheet containing plural metal particles.

16. The control device according to claim 11, wherein when the transparent keycap is pressed down, the elastic element is correspondingly moved and subjected to elastic deformation, and the spatial distance between the first electrode and the second electrode is changed, so that the at least one capacitance change value is formed, wherein the key circuit board assembly generates the at least key press information according to the at least one capacitance change value.

17. The control device according to claim 16, wherein a main control board is electrically connected with the key circuit board assembly and the display panel, wherein the main control board issues the at least one key function visual information to the display panel, and the at least one key function visual information is visible through the transparent keycap, wherein the main control board generates and outputs at least one key function control command according to the at least key press information.

* * * * *